United States Patent [19]
Keane et al.

[11] 4,216,447
[45] Aug. 5, 1980

[54] HIGH PERFORMANCE FERROMAGNETIC FILTERS APPLICABLE FROM THE VHF THROUGH THE MICROWAVE FREQUENCY RANGES

[75] Inventors: William J. Keane; John A. Mezak, both of San Jose, Calif.

[73] Assignee: Eaton Corporation, Cleveland, Ohio

[21] Appl. No.: 966,744

[22] Filed: Dec. 5, 1978

[51] Int. Cl.[2] .................... H03H 7/10
[52] U.S. Cl. .................... 333/207; 333/205; 333/209
[58] Field of Search .................... 333/24.1, 205–207, 333/209, 211

[56] References Cited

U.S. PATENT DOCUMENTS

| | | | |
|---|---|---|---|
| 3,426,297 | 2/1969 | Cohen | 333/205 X |
| 3,546,637 | 12/1970 | Wen | 333/205 |
| 3,740,675 | 6/1973 | Moore et al. | 333/202 X |
| 3,839,677 | 10/1974 | Sedin | 333/202 X |

*Primary Examiner*—Eugene R. LaRoche
*Attorney, Agent, or Firm*—Kevin Redmond

[57] ABSTRACT

Compact, simple, ferromagnetic-filter coupling structures which provide a very high, effective-quality factor Q in the VHF, UHF, and microwave frequency ranges achieved by means of offsetting the ferromagnetic element from the plane of the coupling loops and by phase shifting the current in one of the coupling loops to produce an orthogonal field in the vicinity of the ferromagnetic element.

9 Claims, 15 Drawing Figures

HIGH PERFORMANCE FERROMAGNETIC FILTERS APPLICABLE FROM THE VHF THROUGH THE MICROWAVE FREQUENCY RANGES

BACKGROUND

1. Field

This invention relates to improvements in ferromagnetic filters and, in particular, to nonreciprocal ferromagnetic filters intended for use in the VHF, UHF, and microwave frequency ranges.

2. Prior Art

A ferromagnetic filter, in its rudimentary form, consists of a coupling loop positioned close to a sphere of ferromagnetic material in a magnetic field. The ferromagnetic material, usually yttrium-iron-garnet, can be made to resonate at a frequency determined by the strength of the magentic field. At microwave frequencies, these filters can have a Q ranging from 3,000 to 10,000.

Despite the high Q obtained at microwave frequencies, a ferromagnetic filter is usually not used at VHF or UHF frequencies because of the necessarily large size of the filter and the low Q achievable in these frequency ranges. Ferromagnetic filters are also usually unsatisfactory in the low frequency ranges in bandpass applications because of the high insertion loss of 1 dB or more per filter section.

Ferromagnetic material is doped to overcome a low-level power saturation occurring at low frequencies in this material. A side effect of doping is a reduction in the degree to which the material can be magnetized, making it necessary to position the coupling loops closer to the material. Unfortunately, close positioning increases the number of unwanted frequencies at which the material will resonate, making prior art ferromagnetic filters usually unsatisfactory in the VHF and the UHF ranges.

Difficulties with present ferromagnetic filters are not restricted to the VHF and the UHF frequency ranges. The most commonly available ferromagnetic filters are, for the most part, nonabsorptive, reciprocal devices. Such devices tend to be reflective and to produce high VSWR's.

Attempts have been made to overcome these difficulties by using coupling structures that produce a circularly polarized field in the ferromagnetic material. Nonreciprocal coupling can be induced in this manner, allowing for matched filter structure.

Previous methods of producing circular polarization have required the addition of components such as directional couplers and transmission lines for each filter section. The size and cost of a filter with these additional components made its implementation impractical, especially in low frequency applications.

SUMMARY

By means of the subject invention, a reproducible, apparent Q of 20,000 for band-stop filters has been achieved in both the VHF and the microwave ranges, while previously achieved Q's in the VHF range were only 100 to 500.

To obtain this improved performance, ferromagnetic materials are circularly polarized by means of a coupling structure that is new and that can be fabricated simply and compactly, even for use in the VHF range.

Figure 1:
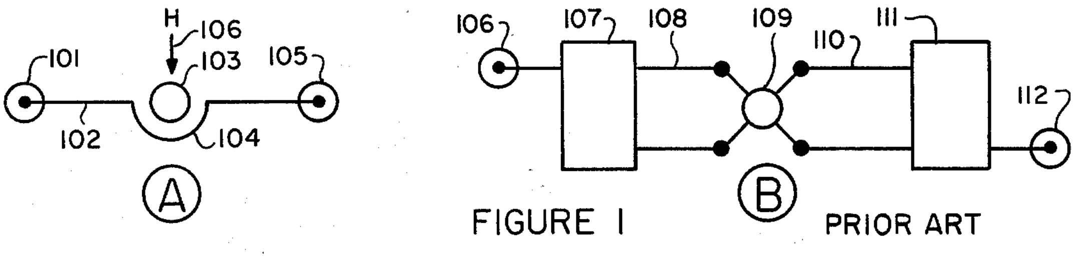
FIGURE 1 PRIOR ART
FIGS. 1A and 1B illustrate a rudimentary ferromagnetic filter.

To aid in understanding the figures, it should be noted that a dot on a line represents a bend in the line. Two closely spaced dots typically represents a loop between the dots in the plane perpendicular to the drawing.

DETAILED DESCRIPTION

The ferromagnetic materials referred to herein are of the class of materials which can be made to resonate when placed in a magnetic field. The most widely used material for this application is yttrium-iron-garnet.

The word static, as applied herein to the magnetic field, refers to the relatively constant strength of the magnetic field to which the ferromagnetic material is subject. However, the static strength of the field may be adjusted about a quiescent value to provide a means of adjusting the resonant frequency of the ferromagnetic material.

FIG. 1A illustrates a rudimentary ferromagnetic filter. In this figure, a single transmission line 102, containing a half loop 104, is terminated in an input port 101 at one end and in an output port 105 at the opposite end. The half loop follows the general contours of a ferromagnetic material 103, which is typically a yttrium-iron-garnet sphere.

The loop provides a means of coupling to the sphere. An H field 106, usually provided by an electromagnet, is shown as it is usually oriented.

In the operation of this filter, an RF signal, applied to input port 101, flows through the line 102 to the output port 105. The ferromagnetic material, when subject to the H field 106, functions as a parallel resonant circuit in series with the line, which reflects the incoming signal at the resonant frequency.

Although reflective filters are suitable in some applications they are usually unsatisfactory in multiplex applications. The reflections from various individual channels produced a high input VSWR.

A more preferable filter for this application is an absorptive filter. An absorptive filter is one in which power is absorbed at the resonate frequency. Such a filter may be produced with a ferromagnetic device by using a conventional cross polarized coupling structure as shown in FIG. 1B.

In this figure, a signal placed on an input port 106 is passed through a divider 107 to lines 108 and 110 which include coupling loops that pass under a ferromagnetic device 109 before being terminated in a combiner 111, which supplies the signal to the output port 112. The divider supplies the signal to lines 108 and 110 with an orthogonal phase relationship.

Although such a structure does provide circularly polarized coupling to the ferromagnetic material and produces an absorptive mode filter, there is appreciable cost in implementing such a device at all frequencies and an additional difficulty in implementing such filters in a convenient configuration at UHF and VHF because of the excessive size of the dividers and the combiners in the lower frequency ranges. For this reason, filters which use circular polarization have not generally been exploited.

Despite the cost and the configuration problem of the circuit of FIG. 1B, it can be used herein to illustrate the means by which a coupling structure produces a circularly polarized field in the ferromagnetic material. In this structure, the lines are spatially orthogonal, and the currents flowing in the lines are phasally orthogonal.

The spatial orthogonality is produced by crossing the coupling loops, while the phasal orthogonality is produced by the divider. These are the conditions necessary to produce a circularly polarized field in the ferromagnetic material and cause this device to function as an absorptive rather than reflective filter at resonance.

The filters shown in FIGS. 1A and 1B are both bandstop filters. However, the device in FIG. 1A is linearly polarized and provides a reflective filter, while the device in FIG. 1B is circularly polarized and provides an absorptive filter.

As noted above, the ferromagnetic material in an absorptive filter, such as the device in FIG. 1B, absorbs power from the lines at its resonant frequency rather than acting as a parallel resonant circuit placed in series with the line, as is the case in FIG. 1A. The device of FIG. 1B is nonreciprocal in that power is withdrawn by the sphere rather than being reflected back to the input port. The nonreciprocal nature of circularly polarized filters is described in more detail in connection with the coupled band-pass devices shown in FIGS. 12 and 13.

The unsatisfactory large size and cost of producing the circular polarization illustrated in FIG. 1B may be overcome by a number of more practical coupling configurations, such as those illustrated in FIGS. 2 through 10.

Figure 2:
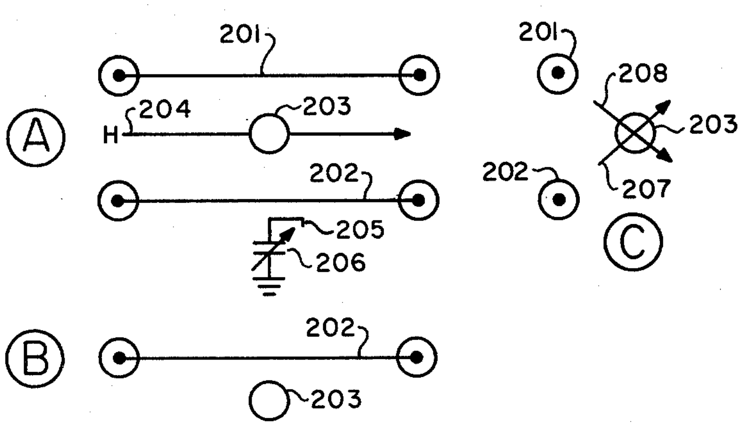
FIGS. 2A, 2B, and 2C illustrate a means of using straight transmission lines to produce circular polarization.

FIG. 2 illustrates a means of producing circular polarization without a 90 degree divider and without crossing the coupling lines. In FIG. 2A, a ferromagnetic device 203 is shown in plan view located between two transmission lines 201 and 202. FIG. 2B is a side view of the device of FIG. 2A, illustrating the position of the ferromagnetic material below the lines.

FIG. 2C is an end view of this device, illustrating the cross polarization of the H fields 207 and 208 in the ferromagnetic material 203 produced by the lines 201 and 202, respectively. Circular polarization may be produced in the device of FIG. 2 by introducing a phase shift of 90 degrees into one of the lines and by placing the ferromagnetic material beneath the lines as shown in FIG. 2B.

In the circuit of FIG. 2, a 90 degree divider is replaced by means of a capacitive reactance 206 which is coupled through means 205 to the line 202. The capacitive reactance can be small in comparison to the divider and combiner devices 107 and 111, shown in FIG. 1B, making it possible to produce a compact, high, apparent Q device in both the VHF and microwave frequency ranges.

Figure 3:
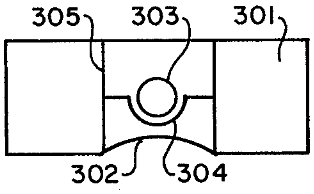
FIG. 3 illustrates a means of using a portion of the filter casing to induce phase shift.

FIG. 3 illustrates a practical means of coupling the capacitive reactance to one of the lines. Typically, a ferromagnetic filter is housed in casing 301, and the coupling loop 304 is passed beneath the ferromagnetic material 303. A plate 302 covers a cavity 305 in the casing which surrounds the filter. The cover 302 may be formed to increase the capacitance between the coupling loop 304 and ground to produce the required phase shift for circular polarization.

Figure 4:
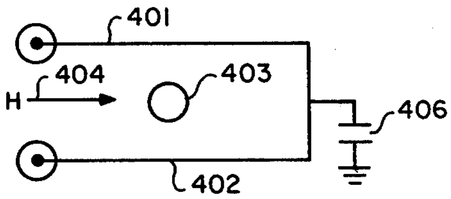
FIG. 4 illustrates a method of introducing passive reactance to produce phase shift.

Another method of incorporating the capacitive reactance is shown in FIG. 4. In this figure, the two lines 401 and 402 are connected together to form a junction after passing the ferromagnetic material 403. The capacitor reactance 406 required to provide the 90 degree phase shift is connected from the junction to ground.

It should be noted that the capacitive reactance may not provide a perfect 90 degree phase shift, and the resulting polarization may not be perfectly circular. However, the polarization produced in this manner is sufficiently circular to provide the desired high apparent Q. The terms "circular" and "generally circular" are intended to include both circular and imperfectly circular or eliptical polarization.

Figure 5:
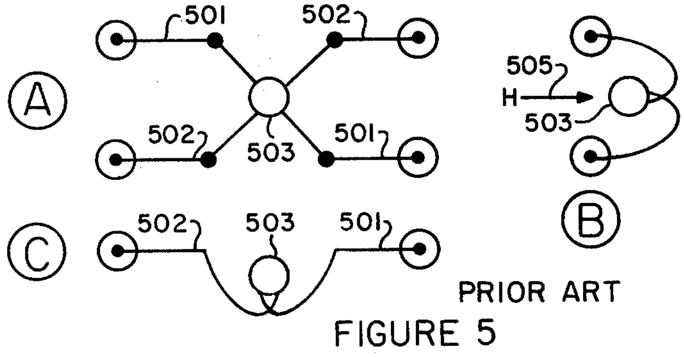
PRIOR ART FIGURE 5
FIGS. 5A, 5B, and 5C illustrate a method of spatially orienting orthogonal lines around ferromagnetic material.

FIG. 5 illustrates another method for producing circular polarization. FIG. 5A shows a plan view of two lines 501 and 502, which are passed beneath a ferromagnetic material 503. FIG. 5B is an end view of the device shown in 5A. FIG. 5C is a side view of the device of FIG. 5A.

Circular polarization is provided in this circuit by supplying current with an orthogonal phase relationship to the two lines and by the spatial orthogonality of the crossed lines in a coupling area.

Figure 6:
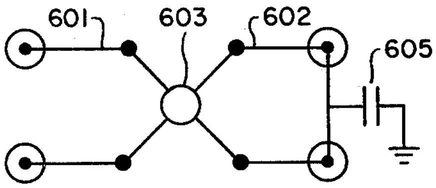
FIG. 6 illustrates a method of coupling capacitive reactance to transmission lines to produce an orthogonal phase relationship.

FIG. 6 shows a method of producing circular polarization in which the orthogonal relationship between the currents is provided by means of a capacitive reactance. After the lines have coupled to the ferromagnetic material they are joined and a capacitive reactance 605 is connected to ground.

Figure 7:
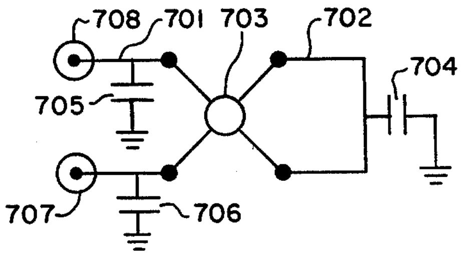
FIG. 7 illustrates a means of producing a low-frequency ferromagnetic filter.

The circuit shown in FIG. 7 is intended to provide a practical ferromagnetic filter for low frequency operation. It is similar to the circuit of FIG. 6 in that the capacitor 704 performs the same function as the capacitor 605 in providing an orthogonal phase relationship between the lines 701 and 702, but additional capacitors 705 and 706 are applied to the lines 701 and 702, respectively, to impedance match these lines for low input VSWR. These additional capacitors may also be made small to provide a compact device for low frequency operation.

Figure 8:
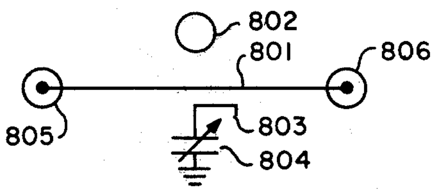
FIG. 8 illustrates a first means of coupling a capacitive reactance to a transmission line.

FIG. 8 illustrates a general method of coupling a capacitive reactance to a single line. In FIG. 8, a capacitive reactance 804 is coupled to line 801 by means of a coupling device 803.

Figure 9:
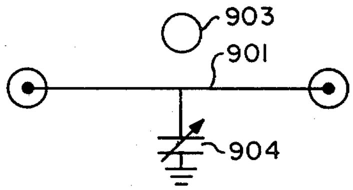
FIG. 9 illustrates a second means of coupling capacitive reactance to induce phase shift in a single transmission line.

FIG. 9 illustrates a simple method of coupling the capacitive reactance to a single line. In FIG. 9, the capacitive reactance 902 is directly connected between the line 901 and ground.

It should be noted that the capacitive reactance may be made variable for tuning purposes, as for example, by means of a varactor diode. This arrangement permits the coupling circuit to track the magnetic resonance of the ferromagnetic material controlled by the static field.

Figure 10:
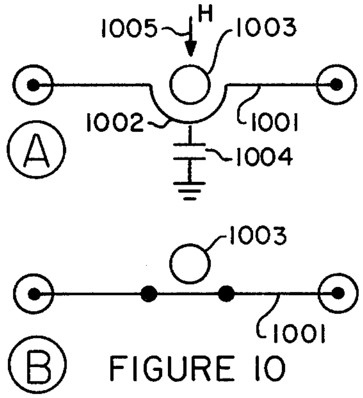
FIGS. 10A and 10B illustrate an offset of the ferromagnetic material from a single-line coupling loop.

FIG. 10 illustrates a practical means of using a single line to provide circularly polarized coupling to the ferromagnetic device. In FIG. 10A, a line 1001 is shown which contains a loop 1002 designed to generally conform to the contours of a ferromagnetic device 1003. Near the center of the loop, a capacitor 1004 is connected between the loop and ground. Drawing numeral 1005 indicates the direction of the static H field.

FIG. 10B is a top view of the configuration shown in FIG. 10A, which illustrates an offset of the ferromagnetic material 1003 from the plane of the line 1002. This offset is necessary in order to locate the ferromagnetic material in an area of circular polarization.

The fields at the center of the loop, where the ferromagnetic material is usually located, do not produce orthogonal fields. However, by offsetting the ferromagnetic material, orthogonal fields are produced.

An equivalent of the single loop and capacitive reactance is a printed circuit line having a corner which exhibits a phase shift. The phase shift may be provided by a number of means, including a stub of lumped capacitance.

In contrast to the present invention, conventional devices are usually constructed with great pains being taken to place the ferromagnetic material at the center of the loop. This procedure eliminates the possibility of taking advantage of the circular polarization and simultaneously eliminating the absorptive mode which provides the high apparent Q obtained with the present invention.

Figure 15:
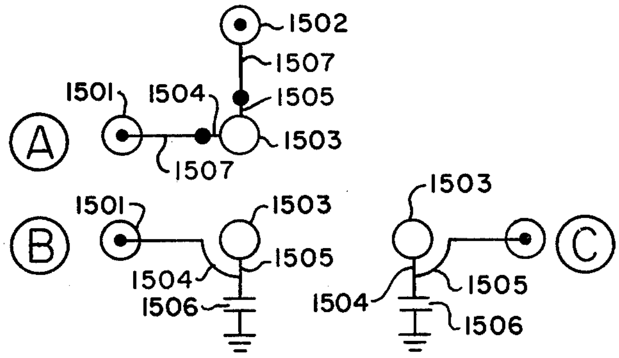
FIGS. 15A, 15B, and 15C illustrate a means of producing cross-polarization with a single loop, without need for offset of the ferromagnetic material.

FIG. 15 illustrates a second means of using a single line to generate a circularly polarized field in the vicinity of the ferromagnetic material. FIG. 15A shows the top view of a line 1507 which has been formed into a loop comprising a first and second segment, designated by drawing numerals 1504 and 1505, respectively. The loop is designed to conform generally to the contours of the ferromagnetic material 1503.

FIG 15B is a front view of the structure, while FIG. 15C is a side view. As can be seen from these two views, the two segments of the loop 1504 and 1505 are oriented at right angles to one another and a capacitor 1506 used to provide a 90 degree phase shift is connected from the center of the loop to ground.

This configuration differs from that of FIG. 10 in that the spatial orthogonality necessary to produce a circularly polarized field is provided by the orientation of the two segments of the loop, rather than by offsetting the ferromagnetic material from the plane of the loop. With the configuration of FIG. 15, the ferromagnetic material may be located within the loop without an offset, as shown, to receive the circularly polarized field.

In configuration where an offset is used, the combined steps of offsetting the ferromagnetic matertial from the loop and coupling a circularly polarized field from the loop into the ferromagnetic material provides an important added advantage in that a number of spurious modes commonly found in prior art structures are eliminated. The offset in many cases need only be slight to obtain an improvement in the reduction of spurious respones.

It is important to note that the offsetting of the ferromagnetic material without the circularly polarized field has the opposite effect, in that the offset by itself produces a high degree of spurious response. This undesired high degree of spurious response was often encountered in prior art devices, but has been eliminated by the present invention.

The sense of polarization in important in eliminating these spurious responses. The sense of polarization depends upon the sense of the static magnetic field, the side of the loop to which the ferromagnetic material is offset, and the direction of signal flow through the device.

In a practical device, these factors may be varied to obtain the correct sense cf polarization and, thus, the desired minimum in spurious response. For example, where a device is found to have a strong spurious response, it may be eliminated by reversing the magnetic field or by offsetting the ferromagnetic material to the opposite side of the coupling loop.

Figure 11:
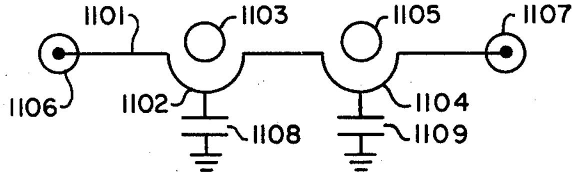
FIG. 11 illustrates a cascaded, single-transmission-line, bandstop filter.

FIG. 11 illustrates a cascaded, single-line band-stop filter. The circuit shown in this figure is essentially a cascade of the device shown in FIG. 10A. This device consists of a line 1101 which includes a first loop 1102 coupling to a first ferromagnetic sphere 1103, a second loop 1104, coupling to ferromagnetic sphere 1105, an input port 1106, and an output port 1107. The ferromagnetic spheres are all offset from the plane of the line 1101, as shown in FIG. 10B.

In the operation of this device, a signal at the input port 1106 is absorbed at the ferromagnetic resonance of the first sphere 1103, as well as at the ferromagnetic resonance of the second sphere 1105, before being applied to the output port 1107. This arrangement forms a band-stop filter in which energy is absorbed at the ferromagnetic resonance of the spheres 1103 and 1105.

Figure 12:
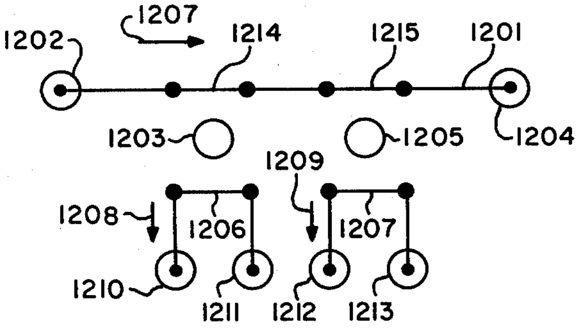
FIG. 12 illustrates a bandstop, bandpass multiplexer, using a single-input transmission line.

FIG. 12 illustrates a band-stop, bandpass, multiplex circuit using a single line. In this Figure, a line 1201 includes an input port 1202 and an output port 1204, a first loop 1214, which couples to a ferromagnetic sphere 1203, and a second loop 1215 which couples to a second ferromagnetic sphere 1205.

A second coupling line 1206 is coupled to the ferromagnetic sphere 1203, while a third line 1207 is coupled to the second ferromagnetic sphere 1205 to form two bandpass filters. The lines 1206 and 1207 include input ports 1211 and 1213 and output ports 1210 and 1212, respectively.

In the operation of this circuit, a signal placed at the input port 1202 of the first line is coupled to the first ferromagnetic sphere 1203 and then to the second ferromagnetic sphere 1205. The portion of the signal at the ferromagnetic resonances of these spheres is coupled from the sphere to lines 1206 and 1207.

The direction of flow is shown by the vectors 1207, 1208, and 1209. This configuration forms a nonreciprocal filter in that energy supplied at the input port 1202 is delivered to the output ports 1210 and 1212, but energy supplied at the output ports is not received at the input port.

This filter operates in the absorptive mode. Power at the resonant frequency of the first ferromagnetic sphere 1203 is absorbed by the sphere 1203 and then transferred to the output port 1210.

When this filter is considered along the path running from input port 1202 to output port 1210, it functions as a bandpass filter. However, at the output port 1204 the energy absorbed through the spheres has been removed, causing the path from input port 1202 to output port 1204 to appear as a band-stop filter.

The circuit of FIG. 12 may be applied to advantage in electronic countermeasure systems. A wide bandwith may be monitored at the output 1204 with a crystal video receiver, while a narrow bandwidth suitable for superheterodyne detection may be monitored at output ports 1210 and 1212.

Figure 13:
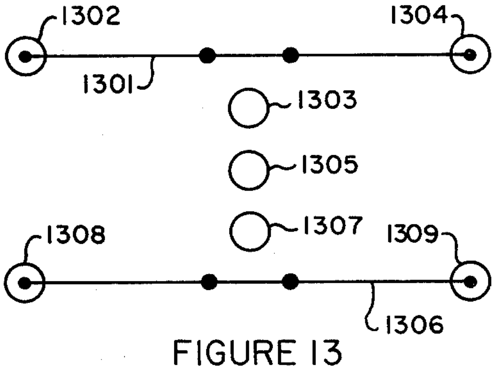
FIG. 13 illustrates a multiple bandpass filter with nonreciprocal coupling.

FIG. 13 illustrates a direct coupled bandpass filter with nonreciprocal coupling. In this device, a first line 1301 includes an input port 1302, and an output port 1304, while a second line 1306 includes an input port 1309 and an output port 1308.

Between the lines are ferromagnetic spheres 1303, 1305, and 1307. In the operation of this device, a signal at the input port 1303 is coupled to the first ferromagnetic sphere by means of circularly polarized coupling.

The energy at the ferromagnetic resonsnce of these devices is coupled from one ferromagnetic sphere to the next until it is supplied to the second line 1306, where it is directed to the output port 1308. The operation is similar to that of the bandpass fitler operation described in connection with FIG. 12 for a single sphere device, but the cascading of the ferromagnetic devices provides a filter characteristic with a sharper rolloff.

Figure 14:
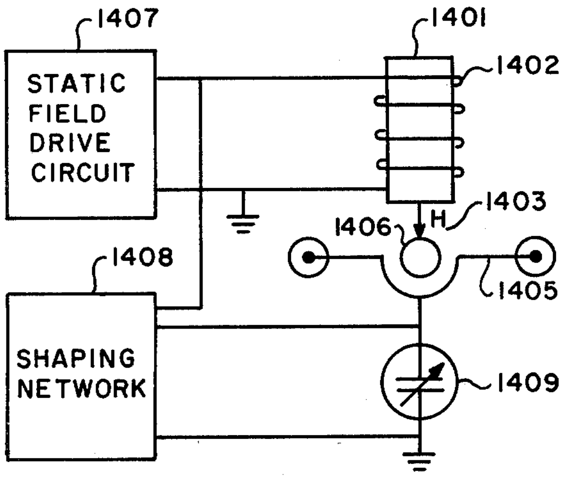
FIG. 14 illustrates a means of producing a cross-polarized filter in which the phase shifting reactance tracks the modulation of the magnetic field.

FIG. 14 illustrates a system designed to maintain a 90 degree phase shift despite changes in the frequency to which the filter is tuned. In this Figure, the filter comprises a line 1404 coupled to ferromagnetic material 1406. The static magnetic field 1403 is produced by an electromagnetic 1401 which includes a winding 1402. The winding 1402 is driven by a static field drive circuit 1407. A 90 degree phase shift is provided by the varacter 1409 for the current flowing in line 1405. The varactor capacitance is controlled by a shaping network 1408, which receives an input signal from the static field drive circuit 1407.

In the operation of the circuit of FIG. 14, the static field drive circuit produces an output singal designed to set the current through the winding 1402 and thus set the H-field 1403. A change in the current in the winding 1402 changes the H-field and the resonance of the ferromagnetic material 1406. Once a new resonant frequency has been set in this manner, the capacitive reactance of the varactor must also be changed to provide a 90 degree phase shift at the new resonant frequency. This is accomplished by modifying the output signal from the static field drive circuit 1407 in the shaping network 1408 to provide a varactor control voltage which will cause the varactor to make an appropriate change in capacitive reactance.

Having described the invention, we claim:

1. A ferromagnetic resonant device of the type in which a ferromagnetic resonant material, subjected to a static magnetic field, is also subject to a generally circularly polarized RF field produced by a coupling structure, comprising:

(a) a first line with a loop passing adjacent the ferromagnetic material to couple to said material, said ferromagnetic material being offset from the plane of said loop, and (b) a capacitive reactance coupled to the generally central portion of said loop in region where said loop couples to said ferromagnetic material to aid in adjusting the currents in the segments of the loop on either side of said capacitive reactance coupling to exhibit a generally orthogonal phase relationship.

2. A device as claimed in claim 1, wherein said capacitive reactance is variable to provide a tunable device.

3. A device as claimed in claim 2, wherein said variable capacitive reactance is a varactor diode to provide electronic tuning of said reactance, whereby said capacitive reactance may be adjusted to track the modulation of said static field applied to tune said ferromagnetic material.

4. A device as claimed in claim 1, wherein said device is housed within a casing and a portion of said casing is adjustable to vary its distance from said line to form said capacitive reactance.

5. A device as claimed in claim 1, wherein said line generally follows the contours of said ferromagnetic material.

6. A device as claimed in claim 5, wherein said capacitive reactance is connected between said loop and ground.

7. A device as claimed in claim 6, further comprising:

(a) a first terminal at one end of said line, and (b) a second terminal at the other end of said line, said first terminal forming the input port of a nonreciprocal band-stop filter with the direction of nonreciprocity being determined by the orientation of said static magnetic field.

8. A device as claimed in claim 6, further comprising:

(a) a plurality of ferromagnetic materials each coupled in cascade to the next, and (b) a second line coupled to the last ferromagnetic material in said cascade to from a nonreciprocal multisection bandpass filter, wherein coupling into and between the materials is by means of a generally circularly polarized field.

9. A ferromagnetic resonant device of the type in which a ferromagnetic resonant material, subjected to a static magnetic field, is also subject to a generally circularly polarized RF field produced by a coupling structure, comprising:

(a) a line with a loop passing adjacent the ferromagnetic material to couple to said material, said loop being divided into two segments, the two segments being positioned in orthogonal planes, and (b) a capacitive reactance coupled to the generally central portion of said loop where the orthogonally positioned segments are located in a region where said loop couples to said ferromagnetic material, to aid in adjusting the currents in the segments of the loop on either side of said capacitive reactance coupling to exhibit a generally orthogonal phase relationship.

* * * * *